United States Patent [19]

Mack

[11] Patent Number: 5,064,469

[45] Date of Patent: Nov. 12, 1991

[54] PREPARATION OF OXIDATION RESISTANT METAL POWDER

[75] Inventor: Arthur G. Mack, Naperville, Ill.

[73] Assignee: Akzo N.V., Netherlands

[21] Appl. No.: 416,570

[22] Filed: Oct. 3, 1989

[51] Int. Cl.$^5$ ............................................. C09K 15/18
[52] U.S. Cl. .................................. 106/14.42; 252/512; 252/513; 252/514; 427/216; 427/217
[58] Field of Search ...................... 252/512, 513, 514; 106/14.13, 14.15, 14.16, 14.42; 427/216, 217

[56] References Cited

U.S. PATENT DOCUMENTS

| | | | |
|---|---|---|---|
| 4,382,981 | 5/1983 | Stoetzer et al. | 427/105 |
| 4,387,115 | 6/1983 | Kitamura et al. | 427/58 |
| 4,539,041 | 9/1985 | Figlarz et al. | 75/0.5 A |
| 4,614,837 | 9/1986 | Kane et al. | 174/68.5 |

FOREIGN PATENT DOCUMENTS

| | | | |
|---|---|---|---|
| 0297677 | 1/1989 | European Pat. Off. | |
| 2157670 | 10/1985 | United Kingdom | 106/14.42 |
| 2171410 | 8/1986 | United Kingdom | |

Primary Examiner—William R. Dixon, Jr.
Assistant Examiner—Anthony J. Green
Attorney, Agent, or Firm—Shirley L. Church; James K. Poole; Louis A. Morris

[57] ABSTRACT

In a process for treating the surface of metal objects the surface is heated in the presence of (i) an amine compound having at least one functionally substituted group and (ii) at least one 1,2-dihydroxy benzene derivative providing and electrically conductive and oxidation resistant metal surface. The metal objects include metal particles constituting a metal powder which after treatment is storable and directly usable in electronics applications.

2 Claims, No Drawings

PREPARATION OF OXIDATION RESISTANT METAL POWDER

FIELD OF THE INVENTION

The present invention relates to the treatment of the surface of metal objects, including the production of conductive metal powders, showing an improved resistance to oxidation and loss of electrical conductivity. Such powders find application in the electronics industry; for example, in metallizations of dielectric surfaces or as filler for filled thermoset polymers, for conductive adhesives for surface mount devices, for EMI paints, for polymer thick film pastes for circuits, and for conductive elastomers for EMI gaskets.

The invention further relates to a composition-of-matter useful for rendering metal surfaces electrically conductive and oxidation resistant.

BACKGROUND OF THE INVENTION

Metal powders find extensive use in the production of electrically conductive articles. Whereas a noble metal such as gold is sufficiently noble to resist oxidation, and silver forms oxides retaining some electrical conductivity, less expensive metals such as copper and nickel will be readily oxidized upon exposure to air. In copper or nickel powder of the desired particle size, non-conductive copper or nickel oxide surface layers are quickly formed to the extent that the powders, as commercially available, do not show any significant bulk conductivity.

This problem has been recognized in the art, and it has been proposed to reduce the oxide surface layers just prior to or during the deposition of the metal powder onto a dielectric substrate (U.S. Pat. No. 4,614,837 and EP-A-297,677). These known methods suffer from the inconvenience that immediate further processing is required after the reduction, because the conductive surfaces formed lack a significant resistance to rapid re-oxidation.

Other known methods being more particularly directed to the incorporation of metal powder into resinous compositions propose the protection of conductive powders by the use of certain antioxidants and/or coupling agents, deposited onto the metal powder or included in the resin composition.

GB-A-2,171,410 discloses polymer compositions containing a metal powder having deposited thereon a combination of an amino compound, such as N-stearyl propylene diamine, and a silane coupling agent, such as 3-aminopropyl trimethoxy silane. As shown by the comparative experiments hereinbelow, these coated powders as such show a limited storability.

According to U.S. Pat. No. 4,387,115 oxidation stabilized compositions can be obtained by curing a mixture of a metallic copper powder having a copper oxide surface film, a reducing agent containing a substituted or unsubstituted ortho or para dihydroxy benzene ring and a curable resin. The mixture may optionally comprise a chelate forming compound, inter alia aliphatic diamines. It is emphasized in this publication that the reduction of the copper oxide should occur during curing of the resin in order to ensure the ability of the resulting cured product to retain conductivity. Therefore, this publication does not provide any suggestion that the chemical compounds mentioned therein in general terms, would show any merits in rendering free copper or nickel powder conductive, let alone resistant to re-oxidation. A comparative experiment hereinbelow shows that the combination of reducing agent and chelating agent effective in Example I, Run No. 5 of U.S. Pat. No. 4,387,115 for rendering copper powder conductive when enclosed in a cured resin matrix, failed to produce an electrically conductive copper powder in the present process.

U.S. Pat. No. 4,382,981 discloses conductive coating compositions containing copper powder and an organic titanate coupling agent. Whereas the use of such organic titanate coupling agents is an option of a preferred embodiment of the present process, it is shown by the comparative experiments below that the sole use of such coupling agents is not effective in the present process.

U.S. Pat. No. 4,539,041 discloses a method for forming metal powder by reducing the oxide, hydroxide or salt of, inter alia, copper or nickel by heating said solid compound suspended in a polyol. The size and shape of particles, as well as their homogeneity, can be controlled in some cases. However, the present process offers a much wider choice of morphology for the conductive powder, since no restriction on the morphology of the starting metal powder apply. Using different starting material the present process is clearly distinct from this known method. Whereas it was found that conductive copper powder can be produced from commercial non-conductive powder by heating in ethylene glycol, the powder thus obtained showed unsatisfactory resistance to oxidation. U.S. Pat. No. 4,539,041 provides no hint to the use of the present reagents which surprisingly produces an enhanced oxidation stability.

Some commercial copper and nickel powders are available for electronic applications, which are believed to comprise a proprietary protective coating. However, these powders when tested, showed either no conductivity at the time supplied or rapidly lost conductivity under more severe storage conditions.

SUMMARY OF THE INVENTION

It is an aim of the present invention to provide a process for producing conductive metal surfaces showing an enhanced oxidation stability. Furthermore, it is an aim to provide conductive metal powder, particularly copper or nickel powder having improved oxidation stability to the extent, that they may be produced centrally and supplied to various users for direct application in metallizations, conductive pastes, conductive plastics, etc. for producing electronic articles having longer lifetimes.

It is also an aim of the invention to provide a composition useful for rendering metal surfaces conductive and oxidation resistant.

These and other aims are attained by a process wherein the surface of commodity metal objects is treated with a combination of a chelating amine compound and a reducing catechol derivative at elevated temperature until substantially all metal compounds present are reduced, and an electrically conductive and re-oxidation resistant surface is obtained.

DETAILED DESCRIPTION OF THE INVENTION

According to the process of the invention, the surface of metal objects, said metal being selected from the group of copper, nickel, cobalt, silver and palladium, is heated in the presence of (i) an amine compound having at least one group carrying a coordinative functional substituent, the amine nitrogen atom and the functional substituent being separated by from two to six other atoms; and (ii) at least one phenolic compound selected from the group consisting of 1,2-dihydroxy benzene and its ring-substituted derivatives, and the resulting conductive surface is substantially separated from the reagents and reaction products.

Suitable objects may have any shape, such as foils, sheets, rods and particles. Also surface layers or metallizations adhered to a non-metallic substrate will fall into the present definition, as long as at least a part of the surface of the assembly is constituted by the metal and is susceptible to the treatment according to the invention. Suitable objects or their relevant surface layers to be subjected to the present process comprise as a major constituent, one or more of the metals indicated above, preferably copper or nickel, and may comprise as further constituents other alloying metals or metal oxides, metal hydroxides or further metal compounds, usually copper or nickel oxides in the form of surface layers resulting from oxidation reactions during storage at the surface of the freshly produced metallic objects. The present process is especially envisaged for treating commercially available commodity copper or nickel powders which normally are non-conductive due to such surface oxide layers.

The shape of the particles in principle is immaterial to the present process, and may be spherical, flaky, oblong, fibrous, irregular, or constitute agglomerates of any of the aforementioned shapes. Practically powders comprising spherical or flaky particles, or their agglomerates, are of most interest. The starting particles to be used in the present process do not require removal of the metal oxides prior to further treatment according to the invention.

The first reagent (i) in the treatment according to the invention is an amine compound, being defined herein as an organic compound derivable from ammonia by replacement of one or more hydrogens by organic groups, and should have at least one group carrying a functional substituent having coordinative capacity towards copper or nickel atoms. Suitable functional substituents include hydroxy, amino, carboxy and mercapto. For enabling metal chelate formation in cooperation with the amine nitrogen atom, the functional substituent should be removed from the latter over a distance of from two to six other atoms, usually carbon atoms, along the interconnecting chain. In case of a carboxy substituent the carbonyl carbon atom is attributed to the interconnecting chain in determining the required distance. Rigid structures, such as para-substituted aromate, will prevent chelate formation and diminish the coordinative ability of the functional substituent. Preferably the group carrying the functional substituent is an aliphatic group. Amine compounds having hydroxyalkyl group are readily available and can be prepared, inter alia, by alkoxylation of any primary or secondary amine. Also readily available are amine compounds having an aminoalkyl group, such as ethylene diamine and propylene diamine and their N-substituted derivatives. Other amine compounds having chelating capacity are mentioned in EP-A-297,677 and are incorporated herein by way of reference. Preferred amine compounds are bis-(2-hydroxyalkyl)$C_{8-20}$ alkyl amines and amides, such as bis-(2-hydroxyethyl) lauryl amine and N, N-bis-(2-hydroxyethyl) lauramide, tetramethyl ethylene diamine, tetramethyl propylene diamine and diethylene triamine.

The second reagent (ii) in the treatment according to the invention is at least one substituted or unsubstituted 1,2-dihydroxy benzene (=catechol). Besides catechol itself, any of its derivatives being substituted at one to four of its remaining ring positions can be used. Suitable substituents include alkyl or alkenyl groups, which may be further substituted, and may be straight or branched, and acid groups, such as carboxylic and sulphonic; aldehyde groups, ester groups, ether groups, amino groups or amido groups. In some cases, combinations of two or more of these phenolic compounds have appeared to be particularly beneficial. Preferred reagents (ii) include 1,2-dihydroxy benzene, 3,5-di-t-butyl 1,2-dihydroxy benzene, 3,4-dihydroxy benzaldehyde and 3,4-dihydroxy benzoic acid.

Singular reagents combining the features (i) (ii) above being both an amine compound and a phenolic compound as defined above may also be used in the present process. Thus a 1,2-dihydroxy benzene substituted by a further group which is an amine carrying a functional substituent, will perform both the chelating and reducing activity and can be used as a single reagent in the present process. Exemplary for such singular reagents (i) (ii) are N-(N'-2-aminoethyl 2-aminoethyl) 1,2-dihydroxy benzamine and diethanol aminoethyl 3,4-dihydroxy benzoic ester.

The treatment according to the invention is carried out at elevated temperatures, so that reduction reactions take place. The amounts of reagents should be sufficient for substantially complete reduction of the metal oxides present, but normally excess of reagents will be used, the excess being separated together with the reaction products after the heating. Generally, the heating temperatures vary between 100° and 300° C.

The treatment may be carried out using neat reagent (i) and (ii) being liquid at the heating temperature. However, practically the separation step will require extensive washing then. Therefore, it is desired to use a liquid carrier having lower viscosity at ambient temperatures and high solubility or miscibility in conventional washing liquids such as isopropanol.

A preferred liquid carrier is ethylene glycol which not only allows for easy separation and washing of the conductive copper or nickel particles but will also function as an auxiliary reducing agent. Thus, ethylene glycol solutions having low concentrations in the order of 1 wt. % of the reagents (i) and (ii) can be used in the present process.

Upon completion of the heating, in the present process the resulting conductive metal surface is separated by any known means. When constituting a powder, the particles will conventionally be filtered, washed with a suitable liquid such as an alcohol, and dried. If desired, the dried powder may be sieved to remove large particles and/or agglomerates.

In one aspect of the invention, a composition useful for treating the surface of metal objects, said metal being selected from the group of nickel, copper, cobalt, silver and palladium is provided, which composition essentially consists of an ethylene glycol solution of (i) from 0.01 to 20 wt. % of an amine compound having at least one group carrying a coordinative functional substituent, the amine nitrogen atom and the functional substituent being separated by from two to six other atoms, and (ii) from 0.01 to 20 wt. % of at least one phenolic compound selected from the group of 1,2- dihydroxy benzene and its ring-substituted derivatives, and balance ethylene glycol.

Preferably, such a composition consists essentially of an ethylene glycol solution of
(i) from 0.1 to 10 wt. % of said amine compound;
(ii) (a) from 0.1 to 10 wt. % of 1,2-dihydroxy benzene; and
(ii) (b) from 0.1 to 10 wt. % of 3,5-di-t-butyl 1,2-dihydroxy benzene, and balance ethylene glycol.

These compositions constitute novel compositions particularly suited for treating the starting metal particles in accordance with the invention, and therefore, constitute an independent embodiment of the same invention. The contemplated uses of the compositions according to the invention include their use for rendering metal surfaces or partial surfaces of formed articles conductive and oxidation resistant. Thus, a tarnished sheet of copper is immersed in a composition of the invention, heated, removed from the bath, washed and dried according to the present process to produce a bright and shiny surface of enhanced resistance to future oxidation.

The invention will be further illustrated by the Examples which follow. Herein, commercially available copper and nickel powders constituted by particles coated with a surface layer of the corresponding metal oxides, were treated according to the invention to produce electrically conductive and oxidation resistant copper or nickel powders.

To allow for a reasonably rapid assessment of the oxidation stability, each sample was subjected to accelerated aging under the following conditions (71 C AGING). The dried powder sample was sieved to remove particles larger than 325 mesh (0.044 mm). The sieved material (10 g) was made into a slurry in 1,2-dichloroethane (15 g) and drawn down onto a sheet of polyetherimide resin (Ultem, ex. General Electric) using a 50 micron draw down bar and allowed to dry. The surface resistivity of the powder coating was measured 4 probe method using a Keithly 195 A digital ohmmeter utilizing its 4 terminal resistance input (modified ASTM F 390) before placing the sample in an oven at 71° C., and the surface resistivity was remeasured at the time intervals mentioned.

In this test, by spreading out the powder, maximum exposure to air is ensured and, by heating, the air oxidation is accelerated. Under practical storage conditions, such as in closed containers at ambient temperature, longer storage with retainment of low resistivity values is observed and Example 12 provides some data for comparing both storage conditions.

EXAMPLE 1

Copper flake (USB CU5000, ex. United States Bronze) 70 lbs. (32 kg) was suspended in ethylene glycol 385 lbs. (175 kg) containing 0.7 lbs. (320 g) each of bis-(2-hydroxyethyl) tallowamine (Armostat 310, ex. Akzo), 1,2-dihydroxy benzene, and 3,5-di-t-butyl 1,2, dihydroxy benzene. The mixture was stirred and brought to reflux (at about 195° C.) and kept at this temperature for 1 hour before cooling and filtering in a Rosenmond filter. The filter cake was washed three times with each 110 lbs. (50 kg) of isopropanol, before drying on the filter by use of a nitrogen purge and vacuum.

The obtained conductive copper flake showed an initial surface resistivity being measured as indicated above of 0.35 Ohm/square. After storage for 1,008 hours in a closed container, a next sample showed a surface resistivity of 0.6 Ohm/square. The results of the aging test are mentioned in Table 1.

EXAMPLE 2

Copper flak (Poudmet 22BB400TV, ex. Poudmet) 100 g was heated in ethylene glycol 250 g with 2 g each of tetramethyl ethylene diamine and 3,4-dihydroxybenzaldehyde at 195° C. for 0.5 hour. After cooling, the flake was separated by filtration and washed three times with 250 ml of isopropanol, dried in a vaccum oven at 80° C. and sieved through a 325 mesh sieve to remove oversized particles. The aging test results are mentioned in Table 1.

EXAMPLE 3

Example 2 was repeated with the difference that the ethylene glycol solution contained 2 g each of N-oleyl-1,3-diaminopropane (Duomeen OL, ex. Akzo) and 3,4-dihydroxy benzoic acid. The aging results are in Table 1.

EXAMPLE 4

As in Example 2, however, using an ethylene glycol solution containing 2 g each of tetramethyl ethylene diamine and 3,4-dihydroxy benzoic acid. The aging results are in Table 1.

EXAMPLE 5

As in Example 2, however, using an ethylene glycol solution containing 1 g each of diethylene triamine and 3,5-di-t-butyl 1,2-dihydroxy benzene. The aging results are in Table 1.

EXAMPLE 6 (CONTROL)

For dissolution and removal of the copper oxide surface layer copper flake (Poudmet 22BB400TV) 100 g was added to a stirred solution of citric acid, 40 g, in 800 ml of a 1:1 water:methanol mixture and stirred for ½ hour. The flake was then filtered and washed with water (4×500 ml) and acetone (4×250 ml) and dried all under a nitrogen atmosphere. The resulting powder was immediately tested in the aging test and represents the aging behavior of unprotected copper powder under the specific test conditions. See Table 1.

EXAMPLE 7 (CONTROL)

Copper flake (Poudmet 22BB400TV) 100 g was suspended in ethylene glycol, 250 g, containing 1 g of diethylene triamine. The mixture was stirred and heated to reflux at about 195° C. for 0.5 hour before cooling, filtering and washing with isopropanol (3×250 ml). Test results in Table I.

EXAMPLE 8 (CONTROL)

Example 7 was repeated, using an ethylene glycol solution of 1 g of 3,5-di-t-butyl 1,2-hydroxy benzene. Test results in Table I.

EXAMPLE 9 (CONTROL)

Example 7 was repeated, using ethylene glycol without any addition of reagents. Examples 7-9 represent treatments using single reagents but not their combination according to the invention. Results in Table I show that in the Control Examples substantial reduction of the copper oxide present at the surface of the particles of the commercial powder is achieved and acceptable initial resistivity values are obtained. However, a substantial oxidation resistance is only obtained in the Examples 1-5 using the combination of reagents according to the invention.

TABLE I

| Time (hours) | Surface Resistivity in 71 C. AGING (Ohm/square) | | | | | | | | |
|---|---|---|---|---|---|---|---|---|---|
| | Ex. 1 | Ex. 2 | Ex. 3 | Ex. 4 | Ex. 5 | Ex. 6 (cont) | Ex. 7 (cont) | Ex. 8 (cont) | Ex. 9 (cont) |
| 0 | 0.35 | 0.8 | 0.5 | 0.87 | 0.8 | 0.5 | 1.8 | 3.6 | 3 |
| 24 | 0.5 | 1 | 1.9 | 3.4 | 1.0 | 2.6 | 5.0 | 8 | 18 |
| 48 | — | — | — | — | 3.0 | 12 | 6.3 | — | 49 |
| 72 | 0.6 | — | — | — | — | — | — | 6000 | 52 |
| 96 | — | 2.4 | 3.7 | 4.0 | 3.5 | 31 | 50 | D | 75 |
| 144-168 | — | 1.8 | 9.5 | 6.5 | 6.0 | 660 | — | | — |
| 216-288 | 0.95 | 3.0 | 22 | 26 | 9.0 | 1M | — | | — |
| 336-360 | 1.5 | — | — | — | — | D | 150 | | 325 |
| 408-504 | — | 7.9 | 150 | 68 | 49 | | 600 | | 500 |
| 600-720 | 2.9 | — | — | — | 310 | | 2400 | | 11K |
| 816-960 | 3.4 | 22 | 1M | 198 | 400K | | D | | D |
| 1104-1224 | — | 200 | D | 460 | D | | | | |

Notes:
(1) Where time ranges are indicated, the resistivity value mentioned was observed at a single point within the indicated time range.
(2) Legends:
M: × 1,000,000
K: × 1,000
D: Discontinued

EXAMPLE 10

Nickel flake (Alcan 756, ex. Aldrich) 200 g was suspended in ethylene glycol (500 g) containing 2 g each of bis-(2-hydroxyethyl) tallowamine (Armostat 310, ex. Akzo), 1,2-dihydroxy benzene, and 3,5-di-t-butyl 1,2-dihydroxy benzene. The mixture was stirred and brought to reflux at about 195° C. and kept there for 1 hour before cooling and filtering (no exclusion of air). The filter cake was washed twice with one liter of isopropanol before drying in a vacuum oven at 75° C. overnight. Results of the aging test are in Table II. For control the untreated starting powder was also tested.

EXAMPLE 11

Example 10 was repeated, however, using another purchased nickel powder, 3 μm, lab. grade ex. Aldrich. The aging test results are in Table II.

TABLE II

| | Surface Resistivity In 71 C. AGING (Ohm/square) | | | | |
|---|---|---|---|---|---|
| | Ex. 10 | | Ex. 11 | | Alcan 752 |
| Treatment | yes | no | yes | no | no |
| Time (Hours) | | | | | |
| 0 | 0.5 | 1K | 0.1 | 3.3 | 1 |
| 24 | 0.65 | 1K | 0.1 | 3.3 | 11 |
| 1368 | 1.2 | 1.1M | 0.1 | 5.6 | 105 |
| 2280 | 2.7 | 1M | 0.15 | 7 | 153 |

Notes:
(1) Alcan 752 nickel flake is sold as a conductive grade.
(2) K: × 1,000
M: × 1,000,000

EXAMPLE 12

Copper flake (Poudmet (22BB400TV) was treated as described in Example 1. The treated flake was placed in a container which was closed without any specific measures to exclude air. At the time intervals indicated, samples were taken from the container, and drawn down onto polyetherimide film and measured for surface conductivity as described for the 71 C AGING test:

| Time in Storage (hours) | Surface Resistivity (Ohm/square) |
|---|---|
| 0 | 1.1 |
| 144 | 1.0 |
| 864 | 2.3 |
| 2,160 | 2.5 |

The sample taken and drawn down after 864 hours of storage was aged at 71° C.:

| Time (hours) | Surface Resistivity in 71 C. Aging (Ohm/square) |
|---|---|
| 0 | 2.3 |
| 24 | 11 |
| 336 | 47 |
| 504 | 6,700 |

Whereas the storage in a closed container is believed to be representative for the practical circumstances of manufacture and use of conductive copper powder, the 71 C AGING test provides a more rapid method for screening and comparing several treatments. The above reference data indicate that passing the 71 C AGING test for 100 hours corresponds to normal storage times with retained conductivity for months.

EXAMPLE 13

A bath of ethylene glycol containing 1 wt. % each of 1,2-dihydroxy benzene, 3,5-di-t-butyl 1,2-dihydroxy benzene and bis-(2-hydroxyethyl) tallowamine (Armostat 310) was heated to 170° C. Thereupon a tarnished sheet of copper was immersed in the hot bath for 30 seconds. After removing the sheet from the bath it was washed with isopropanol and dried. After 1 month exposure to ambient conditions, the bright and shiny surface could still be easily soldered indicating that the surface is well protected from the re-oxidation.

COMPARATIVE EXAMPLE 14

Copper flake (Poudmet 22BB400TV) was heated to 195° C. for 0.5 hour in diethylene glycol monomethylether, 250 g containing 1 g each of 2-methyl hydroquinone, hexamethylene triamine and 1,2-dihydroxy benzene. The flake was then separated by filtration and washed three times with 250 ml of isopropanol, dried in a vacuum oven at 80° C., and tested for oxidation resistance by the 71 C AGING test. Since at 0 hours time the surface resistivity amounted to 600,000 Ohm/square, the test was discontinued. This experiment shows that the chemicals used in Example I, Run 5 of U.S. Pat. No. 4,387,115 cannot be successfully used in the present process.

COMPARATIVE EXAMPLE 15

Example 14 was repeated using, however, an ethylene glycol solution of 3-aminopropyl trimethoxy silane and stearyl propylene diamine. Upon an initial reading of 600 Ohm/square in the 71 C AGING test, again the test was discontinued. This experiment shows that the reagent used in Example 5 of GB-A-2,171,410 cannot be successfully used in the present process.

COMPARATIVE EXAMPLE 16

Copper flake (Poudmet) 100 g was treated with ethylene glycol, 250 g, as described in Example 14, containing however 0.5 g of neoalkyoxy tri (dioctyl)pyrophosphato titanate (LICA 38, ex. Kenrich Petrochemicals) coupling agent. The initial reading in the 71 C AGING test was 4,000 Ohm/square, showing that titanate coupling agent as such are not effective in the present process.

In view of the known use of titanate coupling agent on oxide-free copper surfaces, its compatibility with the reagents used in the present invention was tested. This Example was repeated adding further 1 g each of diethylene triamine and 3,5-di-t-butyl 1,2-dihydroxy benzene to the ethylene glycol solution of the organo titanate. In the 71 C AGING test the below results were obtained:

| Time at 71° C. (hours) | Surface Resistivity (Ohm/square) |
|---|---|
| 0 | 0.27 |
| 20 | 0.6 |
| 96 | 0.7 |
| 168 | 1.4 |
| 288 | 2.0 |
| 336 | 5.0 |
| 624 | 12.0 |
| 888 | 500K |

This experiment shows that, if desired, a coupling agent can be applied to the copper surface by including it in the treatment of the invention, without impairing the oxidation resistance. In fact, some improvement over Example 5 was observed.

I claim:
1. A composition for treating the surfaces of metal objects coated with surface layers of non conductive metal compounds to render said surfaces conductive and oxidation resistant, said metal being selected from the group consisting of copper, nickel, cobalt, silver and palladium, said composition consisting essentially of
   (i) from 0.01 to 20 wt. % of an organic amine compound having an amine nitrogen atom which forms the amine and having at least one group carrying a functional substituent having coordinative capacity towards atoms of the metal, the amine nitrogen atom and the functional substituent being separated by from two to six other atoms along the interconnecting chain of said amine compound;
   (ii) from 0.01 to 20 wt. % of at least one phenolic compound selected from the group of 1,2-dihydroxy benzene and its ring-substituted derivatives;
   (iii) and balance ethylene glycol.
2. The composition of claim 1 consisting essentially of
   (i) from 0.1 to 10 wt. % of said amine compound
   (ii) (a) from 0.1 to 10 wt. % of 1,2-dihydroxy benzene;
   (ii) (b) from 0.1 to 10 wt. % of 3,5-di-t-butyl 1,2-dihydroxy benzene;
   (iii) and balance ethylene glycol.

* * * * *